US007936619B2

(12) United States Patent
Park et al.

(10) Patent No.: US 7,936,619 B2
(45) Date of Patent: May 3, 2011

(54) NONVOLATILE MEMORY, MEMORY SYSTEM, AND METHOD OF DRIVING

(75) Inventors: Joon-Min Park, Seoul (KR); Kwang-Jin Lee, Hwaseong-si (KR); Du-Eung Kim, Yongin-si (KR); Woo-Yeong Cho, Suwon-si (KR); Hui-Kwon Seo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 168 days.

(21) Appl. No.: 12/339,204

(22) Filed: Dec. 19, 2008

(65) Prior Publication Data
US 2009/0161419 A1    Jun. 25, 2009

(30) Foreign Application Priority Data
Dec. 20, 2007    (KR) .................. 10-2007-0134528

(51) Int. Cl.
*G11C 7/00*    (2006.01)

(52) U.S. Cl. ........... 365/189.16; 365/189.011; 365/204; 365/163; 365/148; 365/230.06

(58) Field of Classification Search ............. 365/189.16, 365/189.11, 204, 163, 148, 230.06
See application file for complete search history.

(56) References Cited

U.S. PATENT DOCUMENTS

| 7,542,361 | B2 * | 6/2009 | Sato .......................... 365/205 |
| 7,719,886 | B2 * | 5/2010 | Philipp et al. ............ 365/163 |
| 2006/0067154 | A1 * | 3/2006 | Bedeschi et al. ....... 365/230.06 |
| 2008/0158960 | A1 * | 7/2008 | Sekar et al. ............. 365/185.09 |
| 2008/0174360 | A1 * | 7/2008 | Hsu ........................... 327/536 |

FOREIGN PATENT DOCUMENTS

| JP | 2007226883 A | 9/2007 |
| KR | 1020060043897 A | 5/2006 |
| KR | 1020070005823 A | 1/2007 |

* cited by examiner

*Primary Examiner* — Hoai V Ho
*Assistant Examiner* — Fernando N Hidalgo
(74) *Attorney, Agent, or Firm* — Volentine & Whitt, PLLC

(57) ABSTRACT

Provided are a nonvolatile memory and related method of programming same. The nonvolatile memory includes a memory cell array with a plurality of nonvolatile memory cells and a write circuit. The write circuit is configured to write first logic state data to a first group of memory cells during a first program operation using a first internally generated step-up voltage, and second logic state data to a second group of memory cells during a second program operation using an externally supplied step-up voltage.

18 Claims, 11 Drawing Sheets

NONVOLATILE MEMORY, MEMORY SYSTEM, AND METHOD OF DRIVING

CROSS REFERENCE TO RELATED APPLICATION

This application claims priority to Korean Patent Application No. 10-2007-0134528 filed on Dec. 20, 2007, the subject matter of which is hereby incorporated by reference.

BACKGROUND OF THE INVENTION

The present invention relates generally to a nonvolatile memory using a resistance material, a memory system incorporating the nonvolatile memory, and a method of driving the nonvolatile memory.

Nonvolatile memories using resistance materials include phase-change random access memories (PRAMs), resistive RAMs (RRAMs), and magnetic RAMs (MRAMs). While dynamic RAMs (DRAMs) or flash memories store data in relation to electrical charge, nonvolatile memories having resistance materials store data in relation to the states of a phase-change material such as chalcogenide alloy in the case of PRAMs, the resistance of a variable resistance material in the case of RRAMs, or the resistance a magnetic tunnel junction (MTJ) thin film of a ferromagnetic material in the case of MRAMs.

In particular, the phase-change material of a PRAM becomes crystalline or amorphous as it is cooled after being heated. The phase-change material has low resistance in the crystalline state and high resistance in the amorphous state. The crystalline state has been defined as indicating set data or a data value of 0, and the amorphous state as reset data or a data value of 1.

A PRAM performs a write operation by providing a set pulse or a reset pulse to the phase-change material in order to affect a joule heating. In order to write set data to the conventional PRAM memory cell, its phase-change material is heated to a temperature higher than its melting point in response to the reset pulse and then is quickly cooled. This heating and cooling sequence causes the phase-change material to assume an amorphous state. In order to write reset data, the phase-change material is heated to a temperature which is higher than a crystallization temperature and lower than the melting point, this temperature for the phase-change material is maintained for a predetermined period of time and then cooled. This heating and cooling sequence causes the phase-change material to assume a crystalline state. Here, the time required to write set data is approximately five times longer than the time required to write reset data. For example, the time required to write set data in certain conventional examples is approximately 600 ns, while the time required to write reset data is approximately 120 ns.

SUMMARY OF THE INVENTION

In one embodiment, the invention provides a nonvolatile memory including; a memory cell array comprising a plurality of nonvolatile memory cells, and a write circuit configured to write data having a first logic state (first logic state data) to a first group selected from the plurality of nonvolatile memory cells during a first program operation using a first internally generated step-up voltage, and to write data having a second logic state (second logic state data) to a second group selected from the plurality of nonvolatile memory cells during a second program operation using an externally supplied step-up voltage.

In another embodiment, the invention provides a nonvolatile memory including; a memory cell array comprising a plurality of nonvolatile memory cells, and a write circuit configured in a first mode to write data having a first logic state (first logic state data) to a first group selected from the plurality of nonvolatile memory cells during a program period, and to write data having a second logic state (second logic states data) to a second group selected from the plurality of nonvolatile memory cells during an erase period, and configured in a second mode to write the second logic state data to a third group selected from the plurality of nonvolatile memory cells during the program period and to write first logic state data to a fourth group selected from the plurality of nonvolatile memory cells during the erase period.

In yet another embodiment, the invention provides a memory system including a memory controller and a nonvolatile memory controlled by the memory controller, wherein the nonvolatile memory comprises; a memory cell array comprising a plurality of nonvolatile memory cells, and a write circuit configured to write data having a first logic state (first logic state data) to a first group selected from the plurality of nonvolatile memory cells during a first program operation using a first internally generated step-up voltage, and to write data having a second logic state (second logic state data) to a second group selected from the plurality of nonvolatile memory cells during a second program operation using an externally supplied step-up voltage.

In yet another embodiment, the invention provides a method of driving a nonvolatile memory, wherein the nonvolatile memory comprises a memory cell array comprising a plurality of nonvolatile memory cells initially storing first logic state data, the method including; writing second logic state data to a selected one of the plurality of nonvolatile memory cells using an externally supplied step-up voltage, wherein the second logic state data is written faster than the first logic state data.

DESCRIPTION OF EMBODIMENTS

Figure 1:
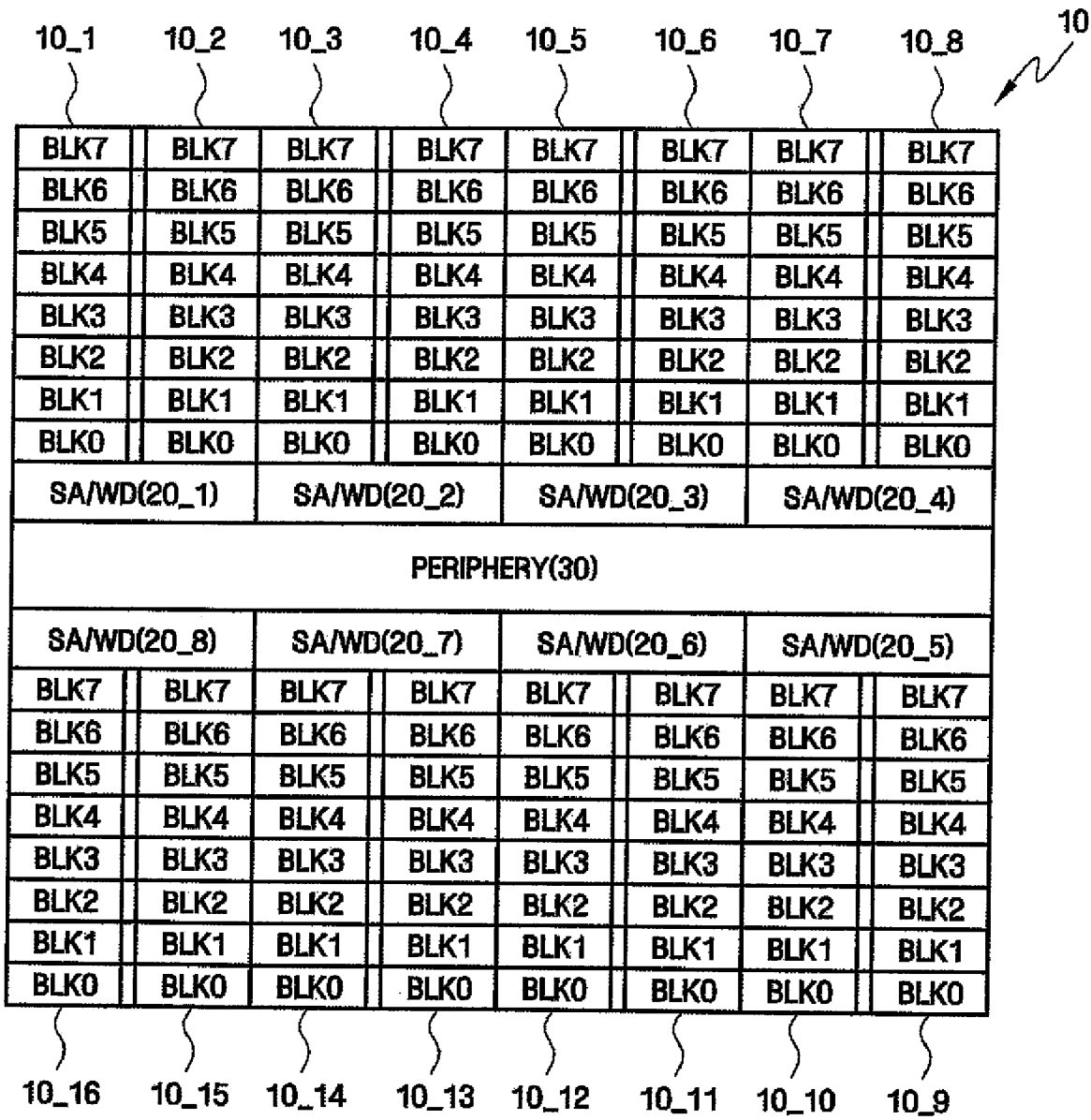
FIG. 1 is a layout diagram illustrating a nonvolatile memory according to an embodiment of the invention.

Advantages and features of the present invention and methods of accomplishing the same may be understood more readily by reference to the following detailed description of preferred embodiments and the accompanying drawings. The present invention may, however, be embodied in many different forms and should not be construed as being limited to only the illustrated embodiments. Rather, these embodiments are presented as teaching examples. Throughout the written description and drawings like reference numerals refer to like or similar elements.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Hereinafter, exemplary embodiments of the present invention will be described using phase-change random access memories (PRAMs). However, it will be apparent to those of ordinary skill in the art that the dictates of the present invention may be applied to all nonvolatile memories using resistance materials, such as RRAMs and MRAMs.

Figure 2:
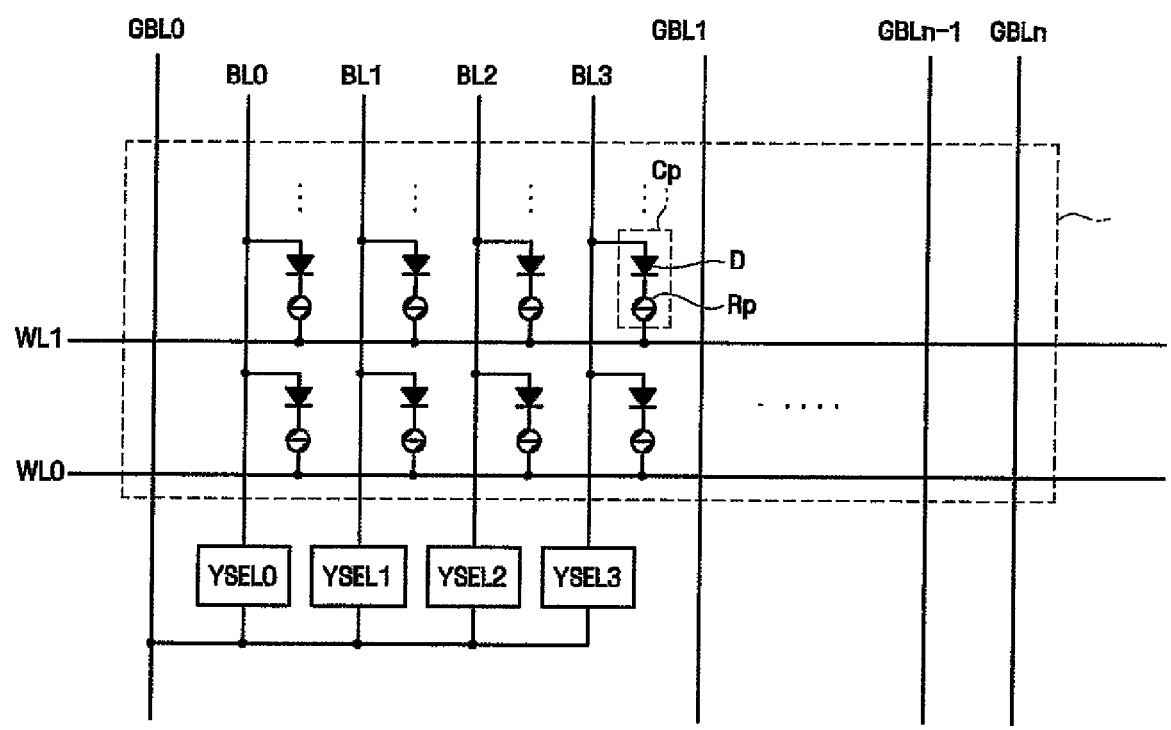
FIG. 2 is a circuit diagram illustrating a nonvolatile memory according to an embodiment of the invention.

FIGS. (FIGS.) 1 and 2 are layout and circuit diagrams illustrating a nonvolatile memory according to an embodiment of the invention. In the exemplary embodiment, a memory cell array having sixteen (16) memory banks is assumed for the sake of simplicity. However, the present invention is not limited to only this architecture. In addition and also for the sake of descriptive simplicity, only a region associated with a memory block BLK0 is illustrated in FIG. 2.

Referring to FIG. 1, the nonvolatile memory comprises a memory cell array 10, a plurality of sense amp, write drivers 20_1 through 20_8, and a peripheral circuit region 30.

The memory cell array 10 includes a plurality of memory banks 10_1 through 10_16, and each of the memory banks 10_1 through 10_16 includes a plurality of memory blocks BLK0 through BLK7. In addition, each of the memory blocks BLK0 through BLK7 includes a plurality of nonvolatile (phase-change) memory cells arranged in a matrix. In the illustrated embodiment, eight memory blocks are arranged in each memory bank. However, sixteen or thirty-two, etc., memory blocks might be arranged in each memory bank.

Although not shown in detail in the drawings, a plurality of row decoders and a plurality of column decoders may be arranged to correspond to the memory banks 10_1 through 10_16 and designate rows and columns of phase-change memory cells to be read or written, respectively.

Each of the sense amp and write drivers 20_1 through 20_8 corresponds to two of the memory banks 10_1 through 10_16 and performs a read or write operation on corresponding memory banks. In the exemplary embodiments of the present invention, each of the sense amp and write drivers 20_1 through 20_8 corresponds to two of the memory banks 10_1 through 10_16. However, the present invention is not limited thereto. That is, each of the sense amp and write drivers 20_1 through 20_8 may also correspond to one or four of the memory banks 10_1 through 10_16.

In the peripheral circuit region 30, a plurality of logic circuit blocks and a plurality of voltage generators are arranged to drive the row decoders, the column decoders and the sense amp and write drivers 20_1 through 20_8.

Referring to FIG. 2, the memory block BLK0 comprises, as an example of all other memory blocks, a plurality of phase-change memory cells Cp, a plurality of global bitlines GBL0 through GBLn, a plurality of bitlines BL0 through BL3, a plurality of wordlines WL0 and WL1, and a plurality of column selection transistors YSEL0 through YSEL3.

Each phase-change memory cell Cp in the plurality of nonvolatile memory cells is arranged at an intersection of a word line in the plurality of wordlines WL0 and WL1 and a bit line in the plurality of bitlines BL0 through BL3. In particular, the bitlines BL0 through BL3 may branch out from each of the global bitlines GBL0 through GBLn in order to have a hierarchical bitline structure. Specifically, the global bitlines GBL0 through GBLn extend in one direction to be common to the memory blocks BLK0 through BLK 7 (see FIG. 1). The bitlines BL0 through BL3 are selectively connected to the global bitlines GBL0 through GBLn by the column selection transistors YSEL0 through YSEL3, respectively, and the phase-change memory cells Cp are connected to each of the bitlines BL0 through BL3.

The phase-change memory cells Cp becomes crystalline or amorphous according to an applied electrical current. That is, each of the phase-change memory cells Cp includes a phase-change material Rp which exhibits a different resistance for each material state, and an access device D controlling the application of current through the phase-change material Rp. The phase-change material Rp is connected between the wordline WL0 or WL1 and the access device D. The phase-change material Rp may a combination of two elements, such as GaSb, InSb, InSe. $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. In particular, GeSbTe, which is a combination of germanium (Ge), antimony (Sb) and tellurium (Te), may be mainly used as the phase-change material Rp. The access device D may be a cell diode including an anode, which is connected to any one of the bitlines BL0 through BL3, and a cathode which is connected to the phase-change material Rp. However, the present invention is not limited to only these design options. For example, a transistor may be used as the access device D.

The column selection transistors YSEL0 through YSEL3 selectively connect the global bitlines GBL0 through GBLn to the bitlines BL0 through BL3 in response to a column selection signal. The column selection signal may be obtained by decoding a column address and block information.

Figure 3:
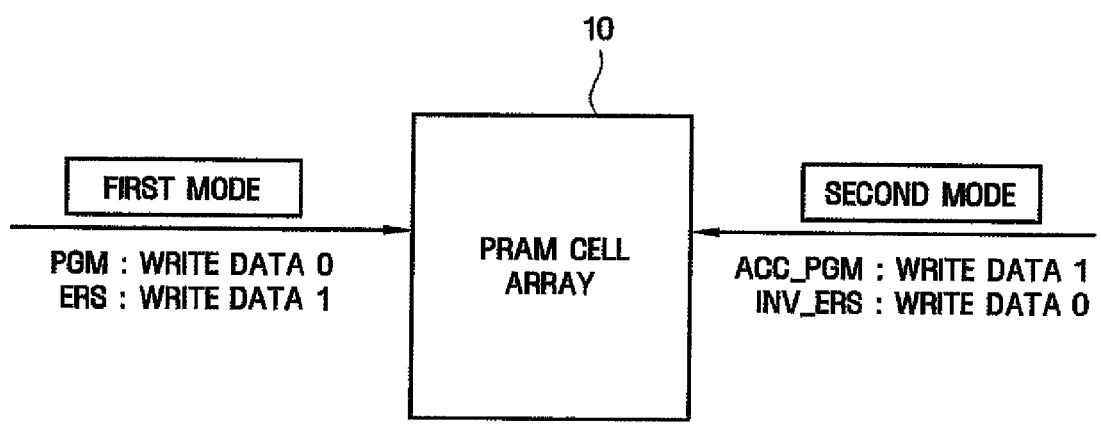
FIG. 3 is a conceptual diagram further illustrating the operation of a nonvolatile memory according to an embodiment of the invention.

FIG. 3 is a conceptual diagram illustrating the operation of a nonvolatile memory according to an embodiment of the invention.

Referring to FIG. 3, a nonvolatile memory using resistance materials may be used as a direct replacement for other types of memory, such as flash memory in various fields of application (e.g., computer systems and portable media systems). In this context, it would be better if the replacing nonvolatile memory having a resistance material were operated in a manner similar to the legacy memory with as few modifications as possible. Therefore, a nonvolatile memory device according an embodiment of the invention may perform a program operation in response to a program command received from an external source, and may additionally perform an erase operation according to an erase command received from the external source.

In addition, a nonvolatile memory according to an embodiment of the invention may operate in a plurality of modes. According to these various modes, the nonvolatile memory may write data 1 or data 0 during a program period and/or write data 1 or data 0 during an erase period.

For example, in a first mode, first logic state data (e.g., data 0 or set data) may be written to a first group of nonvolatile memory cells selected from the plurality of nonvolatile memory cells forming memory cell array 10 during a write or program operation. Second states data (e.g., data 1 or reset data) may be written to a second group of nonvolatile memory cells selected from the plurality of nonvolatile memory cells forming memory cell array 10 during an erase operation.

Here, the nonvolatile memory cells in the first group include one or more nonvolatile memory cells accessed to write first logic state data during the program period. In addition, the nonvolatile memory cells in the second group include one or more nonvolatile memory cells accessed to write second logic state data during the erase period. For example, when the program operation is performed on a word-by-word basis, nonvolatile memory cells, to which the first logic state data from among a word is to be written, are the nonvolatile memory cells in the first group. When the erase operation is performed on a memory block-by-memory block basis, all memory cells in a memory block are the nonvolatile memory cells in the second group.

In a second mode, second logic state data (e.g., data 1 or set data) is written to a third group of nonvolatile memory cells selected from the plurality of memory cells forming the memory cell array 10 during the program period, and first logic state data (e.g., data 0 or set data) is written to a fourth group of nonvolatile memory cells selected from the plurality of memory cells forming the memory cell array 10 during the erase period.

Here, the nonvolatile memory cells in the third group are one or more nonvolatile memory cells accessed to write second logic state data during the program period. In addition, the nonvolatile memory cells in the fourth group are one or more nonvolatile memory cells accessed to write first logic state data during the erase period. For example, when the program operation is performed on a word-by-word basis, nonvolatile memory cells, to which the second logic state data from among a word is to be written, are the nonvolatile memory cells in the third group. When the erase operation is performed on a memory block-by-memory block basis, all memory cells in a memory block are the nonvolatile memory cells in the fourth group.

The operation of the nonvolatile memory in the first and second modes will now be described in some additional detail with reference to FIGS. 3 through 6.

Figure 4:
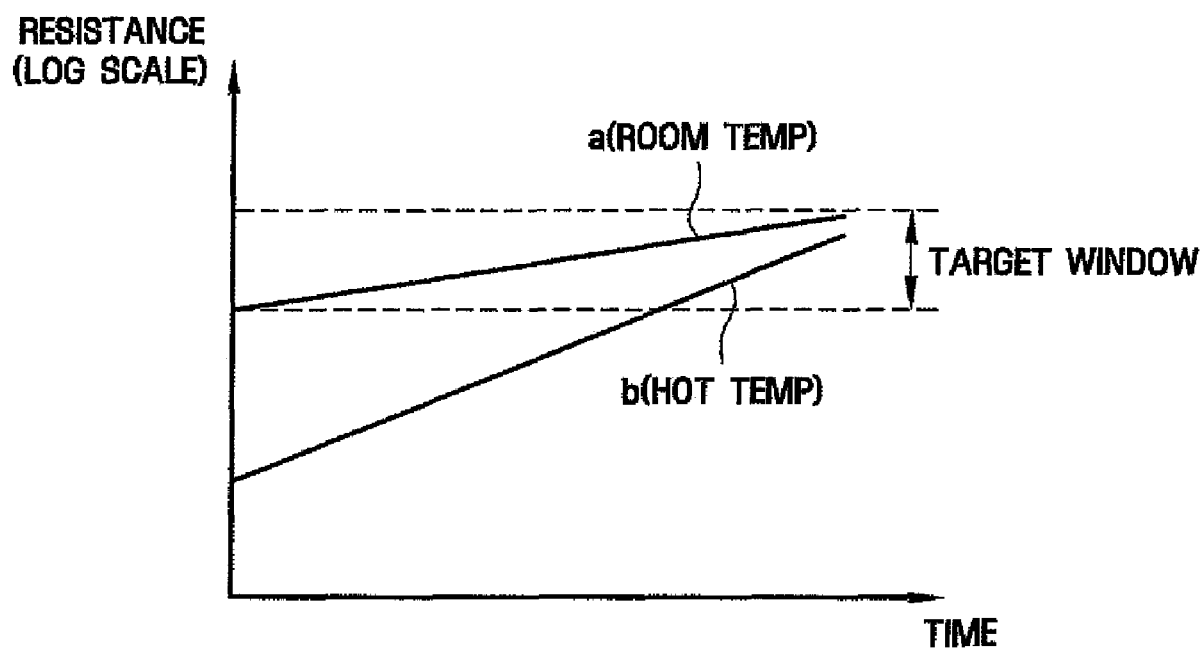
FIG. 4 is a graph illustrating an initial resistance fail.
Figure 5:
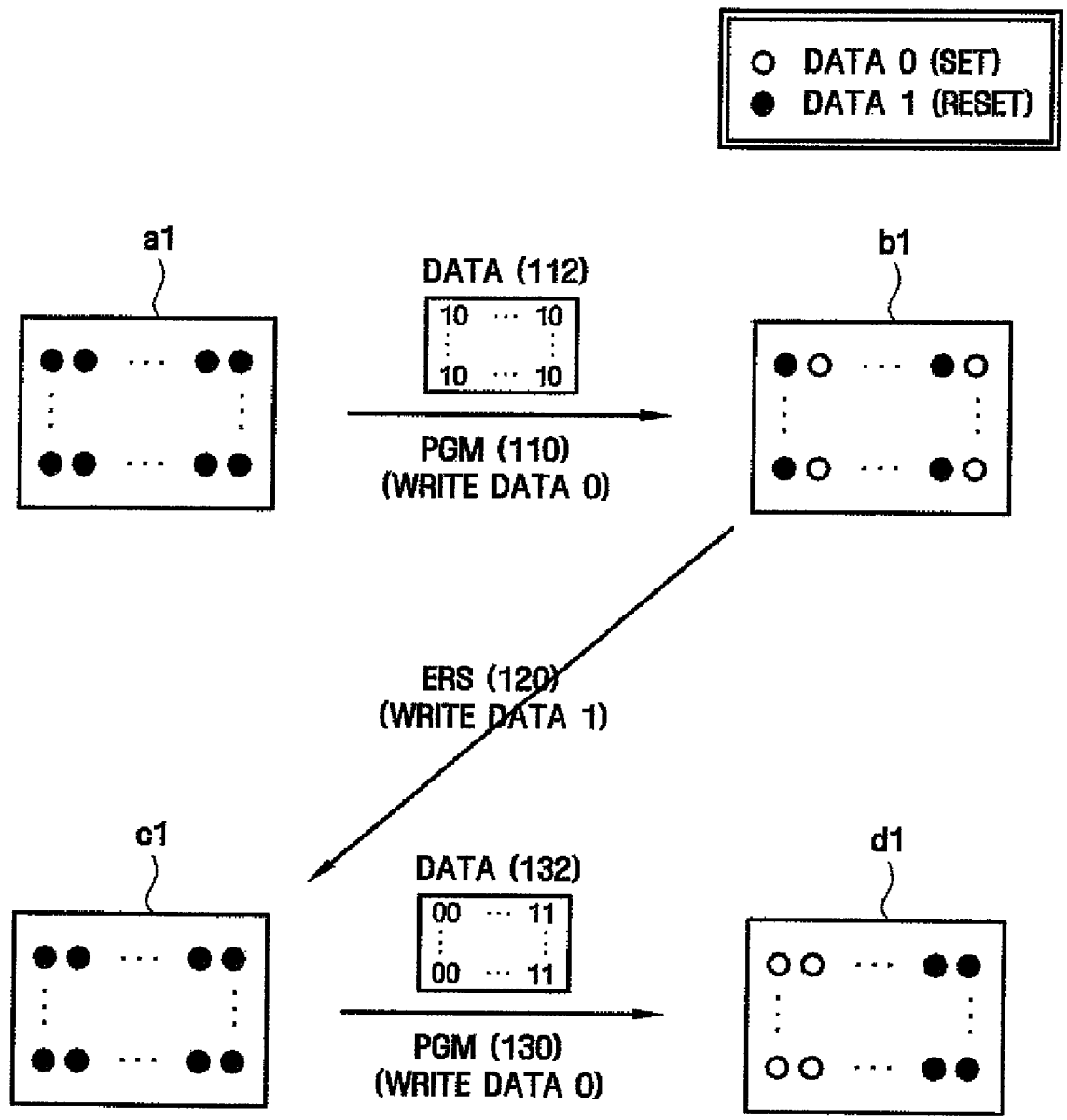
FIG. 5 is a conceptual diagram further illustrating a first mode related to the embodiment shown in FIG. 3.

FIG. 4 is a graph illustrating an initial resistance fail. FIG. 5 is a conceptual diagram further illustrating the first mode associated with the embodiment illustrated in FIG. 3.

With reference to FIG. 3, the first mode may be designated as a normal mode. That is, when performing a normal program or erase operation, a nonvolatile memory according to an embodiment of the invention may operate in the first mode due to the initial resistance fail.

If data stored in a phase-change material is read after a sufficient period of time has elapsed since the data was written to the phase-change material, the particular resistance indicating a data value of the phase-change material cannot be properly read, which is called the initial resistance fail. The initial resistance fail is a more serious problem at high operating temperatures and usually occurs when the reset data is written.

Referring to FIG. 4, the x-axis of the graph indicates time that has elapsed since the reset data was written to the phase-change material according to an embodiment of the invention, and the y-axis indicates the corresponding resistance of the phase-change material. Reference character 'a' indicates the resistance change of the phase-change material at room temperature, and reference character 'b' indicates the change in the phase-change material at a higher operating temperature. A target window denotes an appropriate resistance window of the phase-change material to which the reset data was written.

As may be seen from the graph, the resistance of the phase-change material to which the reset data was written changes over a predetermined period of time after the write operation has been terminated. In particular, at the relatively higher temperature, the resistance of the phase-change material to which the reset data was written changes dramatically. Thus, data stored in a predetermined nonvolatile memory cell cannot be read accurately unless a sufficient period of time elapses after the data is written to the nonvolatile memory cell. That is, a sufficient time margin needs to be secured between a write operation and a read operation in order to accurately read data. The sufficient time margin that needs to be secured after the write operation in order to prevent the initial resistance fail is referred to as data recovery time.

Generally, an erase operation is performed before a program operation. Therefore, in a normal mode, the reset data is written during the erase period, and the set data is written during the program period in order to prevent the initial resistance fail. That is, while the set data is written to a nonvolatile memory cell, the resistance of another nonvolatile memory cell, to which the reset data was written, enters an appropriate resistance window. In other words, a nonvolatile memory cell to which the reset data was written secures the data recovery time while the set data is written to another nonvolatile memory cell.

The operation of the nonvolatile memory in the first mode is illustrated in FIG. 5. Referring to FIG. 5, the reset data is written to all nonvolatile memory cells included in a memory cell array "a1" before a program operation 110 is performed. In the program operation 110, only the set data from among a plurality of input data 112 is written to a memory cell array "b1". If a reprogram operation 130 is needed, an erase operation 120 is performed before the reprogram operation 130. That is, in the erase operation 120, the reset data is written to all nonvolatile memory cells in a memory cell array "c1". Then, in the reprogram operation 130, only the set data from among a plurality of input data 132 is written to a memory cell array "d1".

Figure 6:
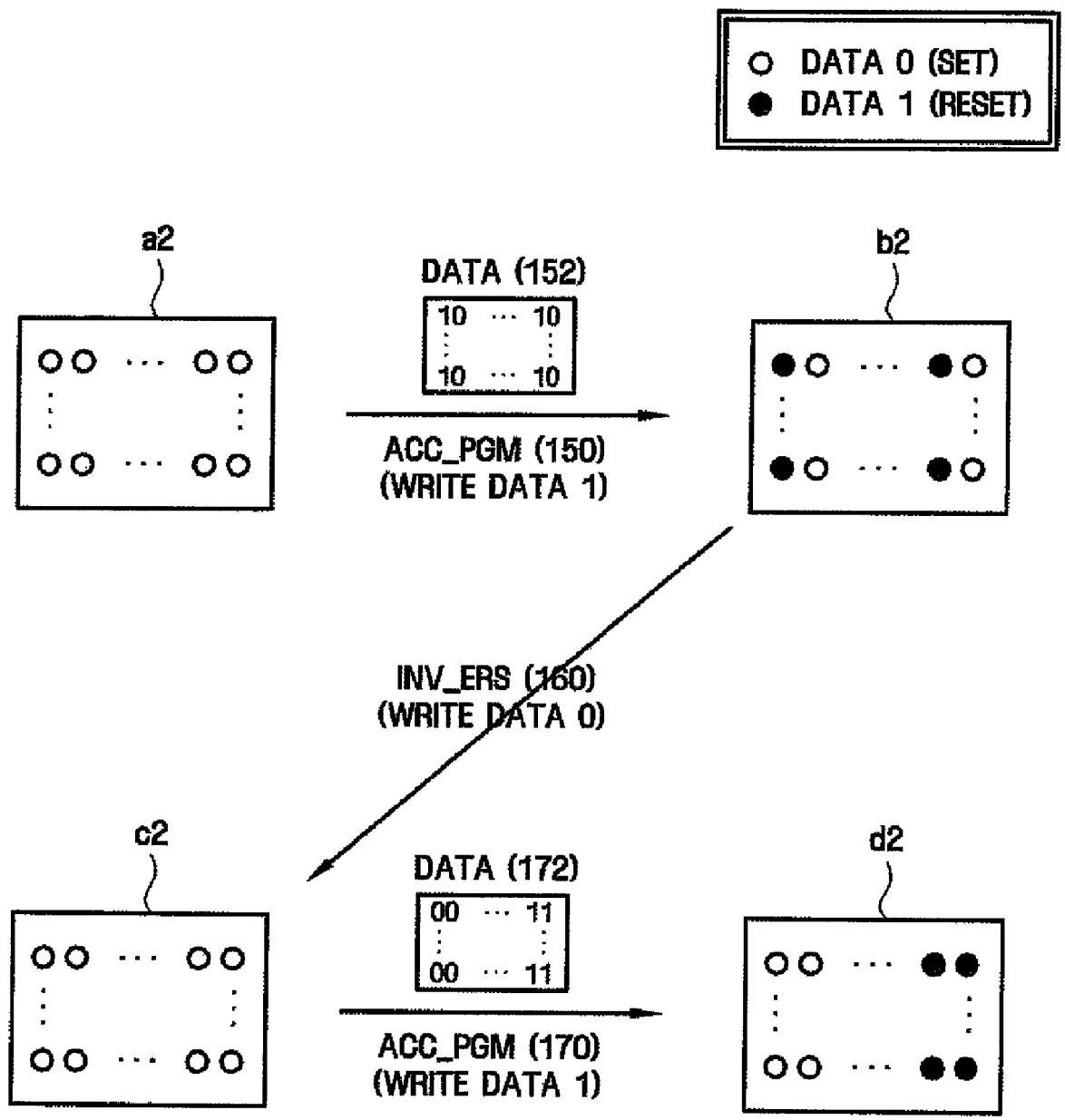
FIG. 6 is a conceptual diagram further illustrating a second mode related to the embodiment shown in FIG. 3.

FIG. 6 is a conceptual diagram further illustrating the second mode associated with the embodiment shown in FIG. 3.

Referring to FIG. 3, the second mode may be designated as an acceleration mode. A program operation in the acceleration mode may be performed within a shorter period of time than that in the first mode (normal mode). The acceleration mode is usually used to perform a program operation on a large scale (e.g., such as when a user programs code to a portable media system including a nonvolatile memory using a resistance material).

Specifically, the time required to write set data may be approximately five times longer than the time required to write reset data. For example, the time required to write set data may be approximately 600 ns, and the time required to write reset data may be approximately 120 ns. Therefore, if a user is required to program a considerable amount of data and chooses to use (or must use) a program operation operated in normal mode, too much time may be required. In this regard, a nonvolatile memory according to an embodiment of the invention may instead support a program operation in the acceleration mode by writing the reset data. The operation of the nonvolatile memory in the second mode is illustrated in FIG. 6.

Referring to FIG. 6, set data is written to all nonvolatile memory cells included in a memory cell array "a2" before a program operation 150 is performed. When the nonvolatile memory is produced all nonvolatile memory cells therein may store the set data. That is, a manufacturer of the nonvolatile memory may write the set data to all nonvolatile memory cells in the nonvolatile memory and then release the nonvolatile memory to the market. This is for the convenience of a user who will perform a program operation in the second mode (i.e., the acceleration mode).

In the program operation 150, only the reset data from among a plurality of input data 152 is written to a memory cell array "b2". As described above, the time required to write reset data is one fifth of the time required to write set data. Therefore, a user, who performs a large-scale program operation, can reduce the amount of time required to perform the program operation.

If a reprogram operation 170 is needed, an erase operation 160 is performed before the reprogram operation 170. That is, in the erase operation 160, set data is written to all nonvolatile memory cells included in a memory cell array "c2". In an erase operation in the second mode, set data is written unlike in an erase operation in the first mode.

Then, in the reprogram operation 170, the reset data from among a plurality of input data 172 is written to a memory cell array "d2".

A program operation in the second mode may be referred to as an acceleration program (ACC_PGM), and an erase operation in the second mode may be referred to as an inverse erase (INV_ERS). The reason why the program operation in the second mode is referred to as the acceleration program is that the program operation in the second mode is performed faster than the program operation in the first mode. In addition, the reason why the erase operation in the second mode is referred to as the inverse erase is that data (set data) having the first logic state is written in the erase operation of the second mode whereas data (reset data) having the second logic state is written in the erase operation of the first mode.

The first mode may be used when a write circuit performs a write operation using an internal step-up voltage. The term "internal step-up voltage" indicates an internally generated voltage. Whereas, the second mode may be used when the write circuit performs a write operation using an external step-up voltage provided by an external source.

Figure 7:
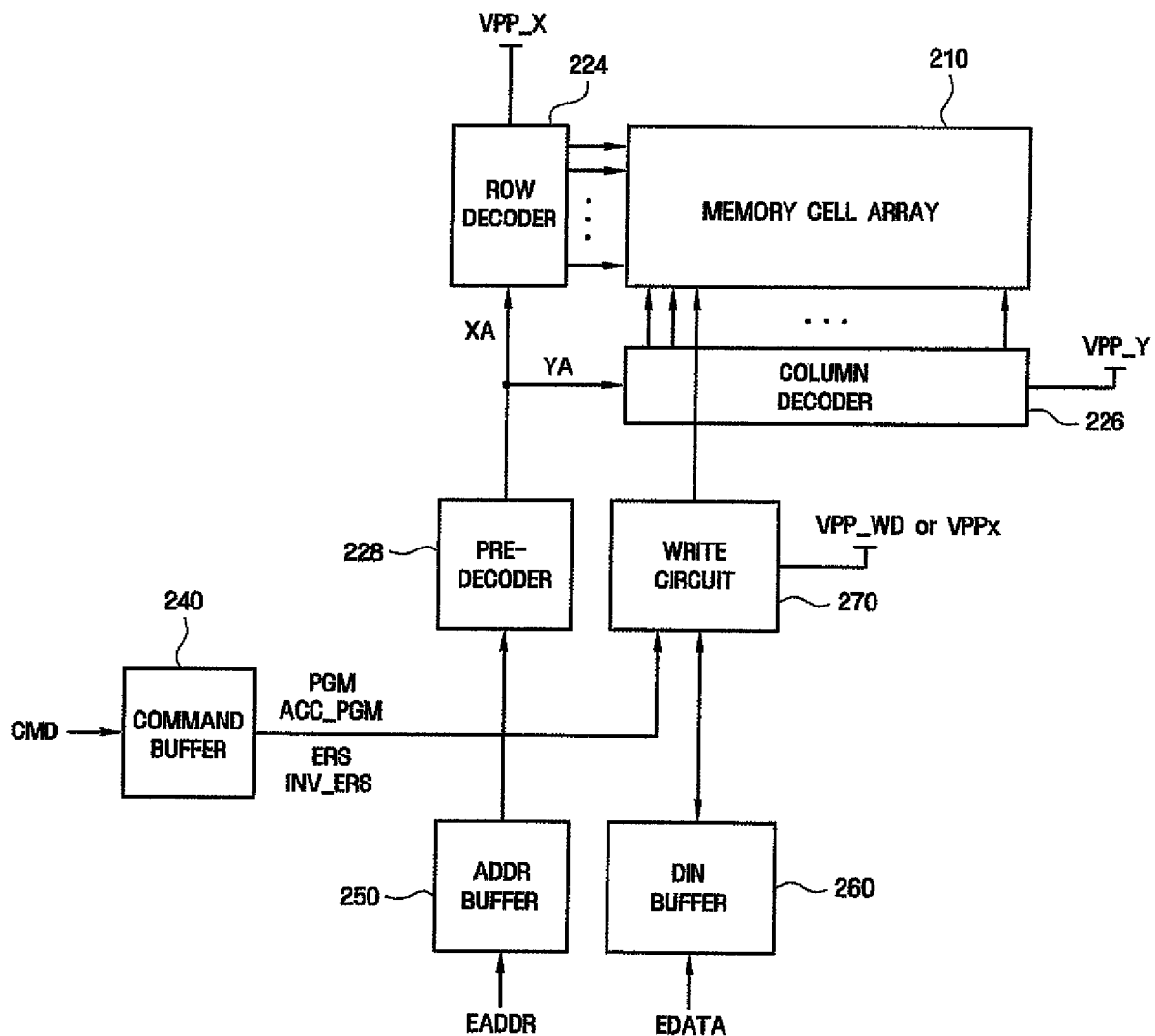
FIG. 7 is a block diagram illustrating of a nonvolatile memory according to an embodiment of the invention.
Figure 8:
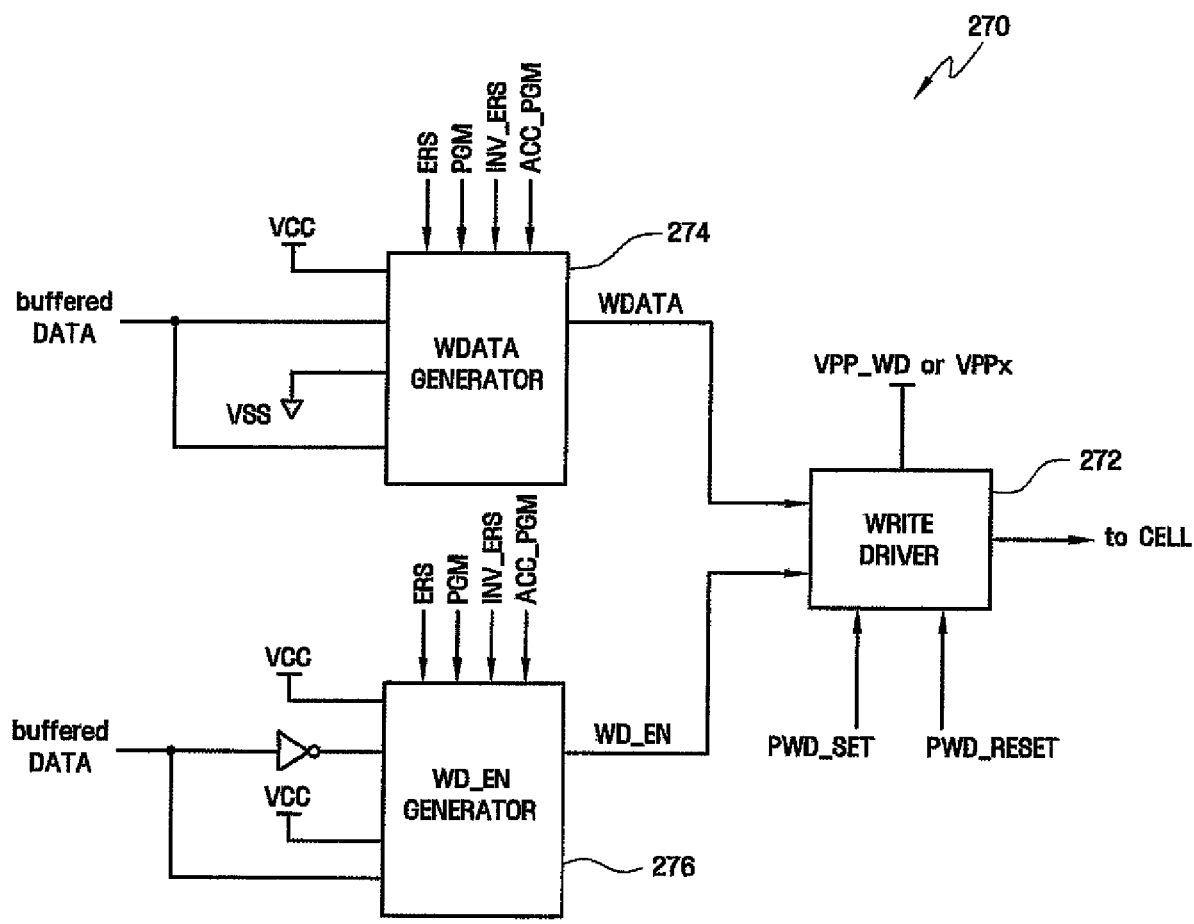
FIG. 8 is a block diagram further illustrating the write circuit of the embodiment shown in FIG. 7.

FIG. 7 is a block diagram of a nonvolatile memory according to an embodiment of the invention. FIG. 8 is a block diagram further illustrating write circuit 270 shown in FIG. 7. The circuit block diagrams of FIGS. 7 and 8 may be used to implement the operations described above with reference to FIGS. 3 through 6. However, these operations may be various implemented in hardware, firmware, and/or software according to different designs consistent with the principals of the present invention.

Referring to FIG. 7, the nonvolatile memory according to an present embodiment of the invention comprises a memory cell array 210, a row decoder 224, a column decoder 226, a pre-decoder 228, a command buffer 240, an address buffer 250, a data input buffer 260, and the write circuit 270.

The memory cell array 210 includes a plurality of nonvolatile memory cells. As described above, the nonvolatile memory cells become crystalline or amorphous according to current that flows therethrough. In addition, each of the nonvolatile memory cells includes a phase-change material, which has different resistance in each state, and an access device which controls current that flows through the phase-change material.

The row decoder 224 receives a row address XA from the pre-decoder 228, decodes the received row address XA, and designates a row of phase-change memory cells to be written. The column decoder 226 receives a column address YA from the pre-decoder 228, decodes the received column address YA, and designates a column of phase-change memory cells to be written. The row decoder 224 may operate using a first internal step-up voltage VPP_X. In addition, the column decoder 226 may operate using a second internal step-up voltage VPP_V.

The command buffer 240 receives a command CMD from an external source and generates a first internal program signal PGM related to the program operation in the first mode, a second internal program signal ACC_PGM related to the program operation in the second mode, a first internal erase signal ERS related to the erase operation in the first mode, or a second internal erase signal INV_ERS related to the erase operation in the second mode.

The address buffer 250 receives an external address EADDR from an external source, buffers the received address EADDR, and provides the buffered address EADDR to the pre-decoder 228.

The data input buffer 260 receives external data EDATA from an external source, buffers the received data EDATA, and provides the buffered data EDATA to the write circuit 270.

The write circuit 270 receives the buffered data and any one of the first and second internal program signals PGM and ACC_PGM and the first and second internal erase signals ERS and INV_ERS. The write circuit 270 writes the buffered data to the memory cell array 210 in response to any one of the first and second internal program signals PGM and ACC_PGM and the first and second internal erase signals ERS and INV_ERS. The detailed configuration and operation of the write circuit 270 will be described in detail later with reference to FIG. 8. The write circuit 270 may operate using a third internal step-up voltage VPP_WD or an external step-up voltage VPPx, which will be described in detail later with reference to FIGS. 9 and 10.

Referring to FIG. 8, write circuit 270 comprises a write driver 272, a write data generator 274, and a write driver enable signal provider 276.

The write driver 272 is enabled in response to a first enable signal WD_EN, receives a set pulse control signal PWD_SET and a reset pulse control signal PWD_RESET, and selectively provides a set pulse or a reset pulse according to write data WDATA. For example, when the write driver 272 receives the set data, it generates the set pulse using the set pulse control signal PWD_SET and provides the generated set pulse to nonvolatile memory cells. When the write drive 272 receives the reset data, it generates the reset pulse using the reset pulse control signal PWD_RESET and provides the generated reset pulse to the nonvolatile memory cells.

The operations of the write data generator 274 and the write driver enable signal provider 276 are summarized in Table 1 below. For the simplicity of description, it is assumed in Table 1 that the write driver 272 is enabled in response to the first enable signal WD_EN in a high level. In addition, the write data WDATA in a high level represents the reset data, and the write data WDATA in a low level represents the set data.

TABLE 1

|  | ERS | PGM | INV_ERS | ACC_PGM |  |  |
|---|---|---|---|---|---|---|
| WDATA | H | L | H | L | L | H |
| WD_EN | H | H | L | H | L | H |

Referring to FIG. 1, when receiving the first internal erase signal ERS in a high level, the write data generator 274 provides the write data WDATA in a high level using a power supply voltage VCC. When receiving the first internal program signal PGM in a high level, the write data generator 274 outputs buffered data as the write data WDATA without modification. In addition, when receiving the second internal erase signal INV_ERS in a high level, the write data generator 274 provides the write data WDATA in a low level using a ground voltage VSS. When receiving the second internal program signal ACC_PGM in a high level, the write data generator 274 outputs the buffered data as the write data WDATA without modification.

When receiving the first internal erase signal ERS in a high level, the write driver enable signal provider 276 provides the first enable signal WD_EN in a high level using the power supply voltage VCC. When receiving the first internal program signal PGM in a high level, the write driver enable signal provider 276 inverts buffered data and outputs the inverted data as the first enable signal WD_EN. When receiving the second internal erase signal INV_ERS in a high level, the write driver enable signal provider 276 provides the first enable signal WD_EN in a high level using the power supply voltage VCC. When receiving the second internal program signal ACC_PGM in a high level, the write driver enable signal provider 276 outputs the buffered data as the first enable signal WD_EN without modification.

Due to these operations of the write data generator 274 and the write driver enable signal provider 276, the write driver 272 writes the reset data when the first internal erase signal ERS is in a high level, writes the set data when the first internal program signal PGM is in a high level, writes the set data when the second internal erase signal INV_ERS is in a high level, and writes the reset data when the second internal program signal ACC_PGM is in a high level.

Figure 9:
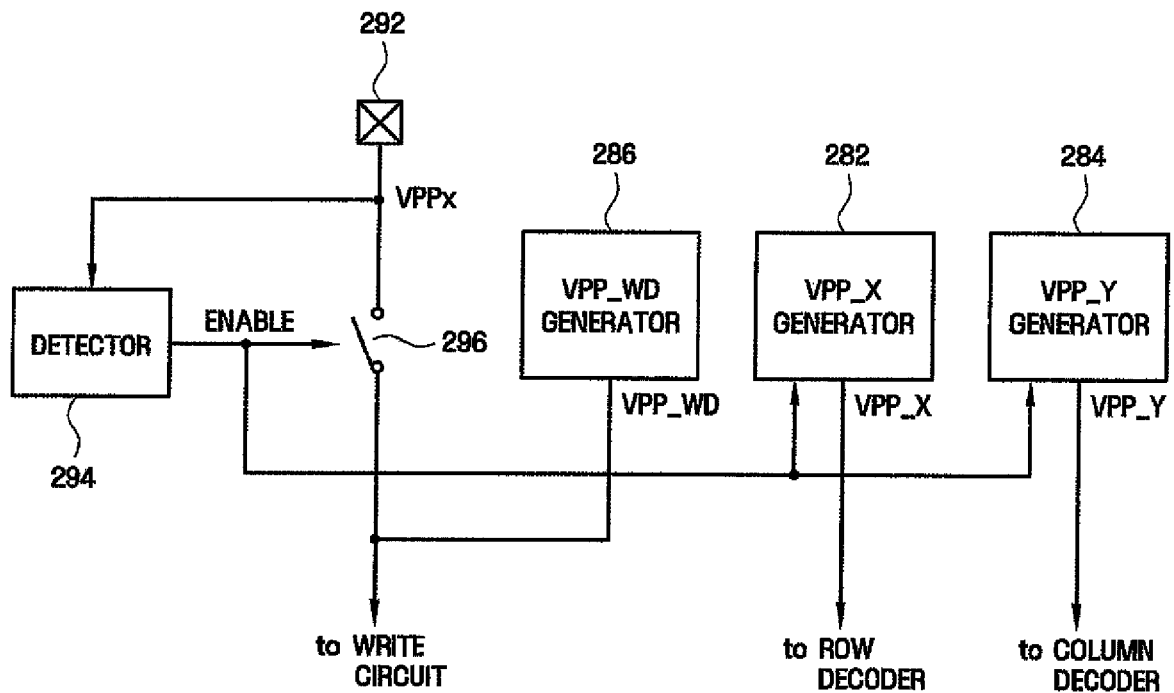
FIG. 9 is a block diagram illustrating a nonvolatile memory according to another embodiment of the invention.
Figure 10:
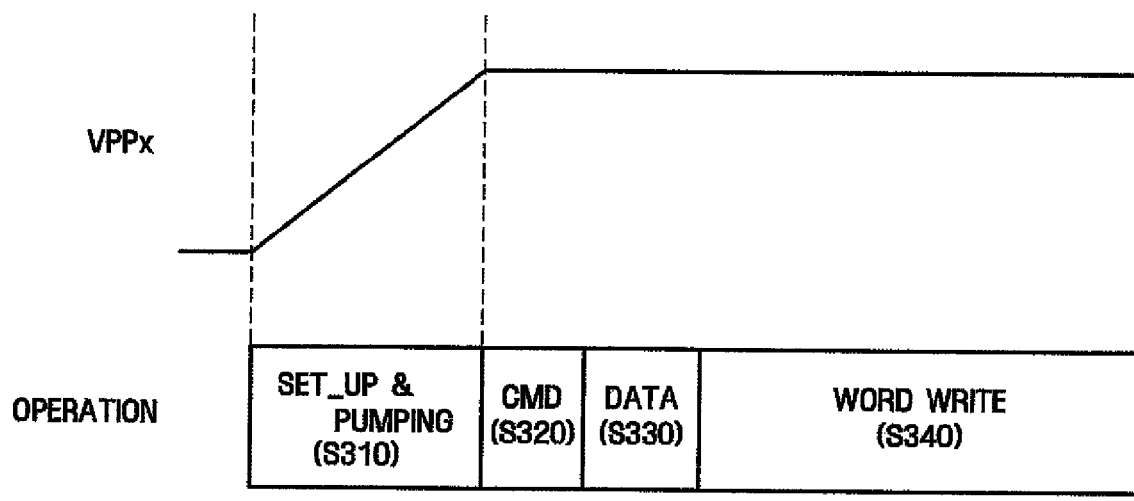
FIG. 10 is a conceptual diagram further illustrating the operation of the embodiment shown in FIG. 9.

FIG. 9 is a block diagram of a nonvolatile memory according to another embodiment of the invention. FIG. 10 is a conceptual diagram further explaining the operation of the nonvolatile memory shown in FIG. 9.

Referring to FIGS. 7 and 9, a row decoder 224 operates using a first internal step-up voltage VPP_X generated by a first internal step-up voltage generator 282, and a column decoder 226 operates using a second internal step-up voltage VPP_Y generated by a second step-up voltage generator 284.

In the illustrated embodiment, a write circuit 270 operates using a step-up voltage. When necessary, the step-up voltage may be a third internal step-up voltage VPP_WD generated by a third internal step-up voltage generator 286 or an external step-up voltage VPPx provided by an external source. For example, the write circuit 270 may use the third internal step-up voltage VPP_WD which is internally generated in the first mode (that is, the normal mode) or use the external step-up voltage VPPx which is provided by the external source in the second mode (that is, the acceleration mode).

The program operation in the second mode will now be described in some additional detail with reference to FIGS. 7, 9 and 10.

As described above, set data may have already been written to all nonvolatile memory cells included in a memory cell array. That is, when a nonvolatile memory is produced, all nonvolatile memory cells included in the nonvolatile memory may store set data.

Referring to FIG. 10, when the external step-up voltage VPPx is applied to an external destination via a voltage pin 292, the level of the external step-up voltage VPPx starts to increase (S310). A section in which the level of the external step-up voltage VPPx increases is referred to as a set-up section.

A detector 294 detects the level of the external step-up voltage VPPx and, when determining that the level of the external step-up voltage VPPx is higher than a reference voltage level, provides a second enable signal ENABLE.

The second enable signal ENABLE enables the connection between the voltage pin 292 and the write circuit 270 and the connection between the first and second internal step-up voltage generators 282 and 284. That is, a switch 296 electrically connects the voltage pin 292 to the write circuit 270, and the first and second internal step-up voltage generators 282 and 284 start to generate first and second internal step-up voltages VPP_X and VPP_Y, respectively.

A command buffer 240 receives a program command from an external source and generates a second internal program signal ACC_PGM related to the program operation in the second mode (S320).

Then, a data input buffer 260 receives external data EDATA from an external source (S330).

The write circuit 270 receives the second internal program signal ACC_PGM from the command buffer 240 and buffered data from the data input buffer 260 and performs a write operation (S340). Here, the write circuit 270 writes only the reset data from among the buffered data to the memory cell array.

In the present embodiment, since the first and second internal step-up voltage generators 282 and 284 are enabled in response to the second enable signal ENABLE, they are enabled in the set-up section. That is, the first and second internal step-up voltage generators 282 and 284 may be enabled before the command buffer 240 receives the program command from the external source.

Therefore, in the present embodiment, the time required by the first and second internal step-up voltage generators 282 and 284 to generate the first and second internal step-up voltages VPP_X and VPP_Y, respectively, can be reduced as compared to when the first and second internal step-up voltage generators 282 and 284 are enabled after the set-up section. This is because the first and second internal step-up voltages VPP_X and VPP_Y are generated in the set-up section.

The reason why the program operation is performed using the external step-up voltage VPPx in the second mode will now be described in some additional detail with reference to FIGS. 11 through 15.

Figure 11:
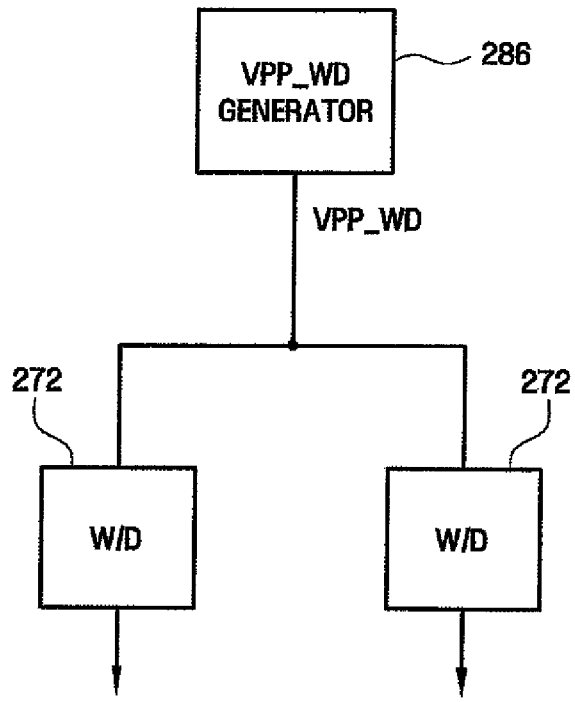
FIGS. 11 and 12 are related block and timing diagrams further illustrating a program operation performed using a third internal step-up voltage.
Figure 12:
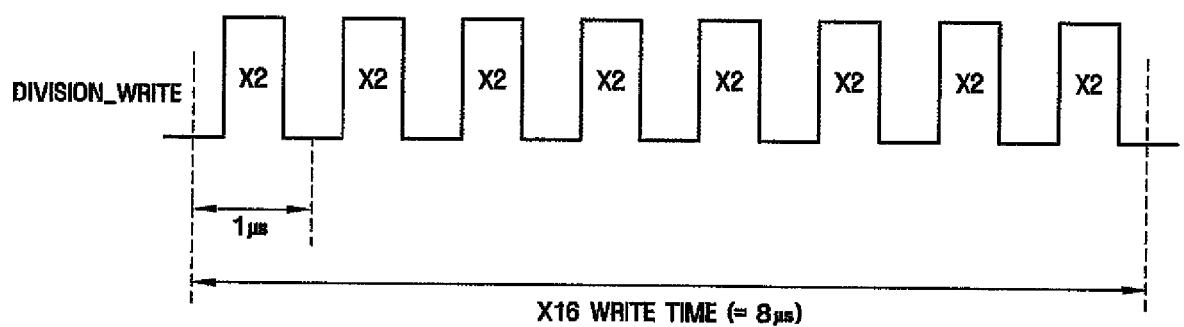
Figure 13:
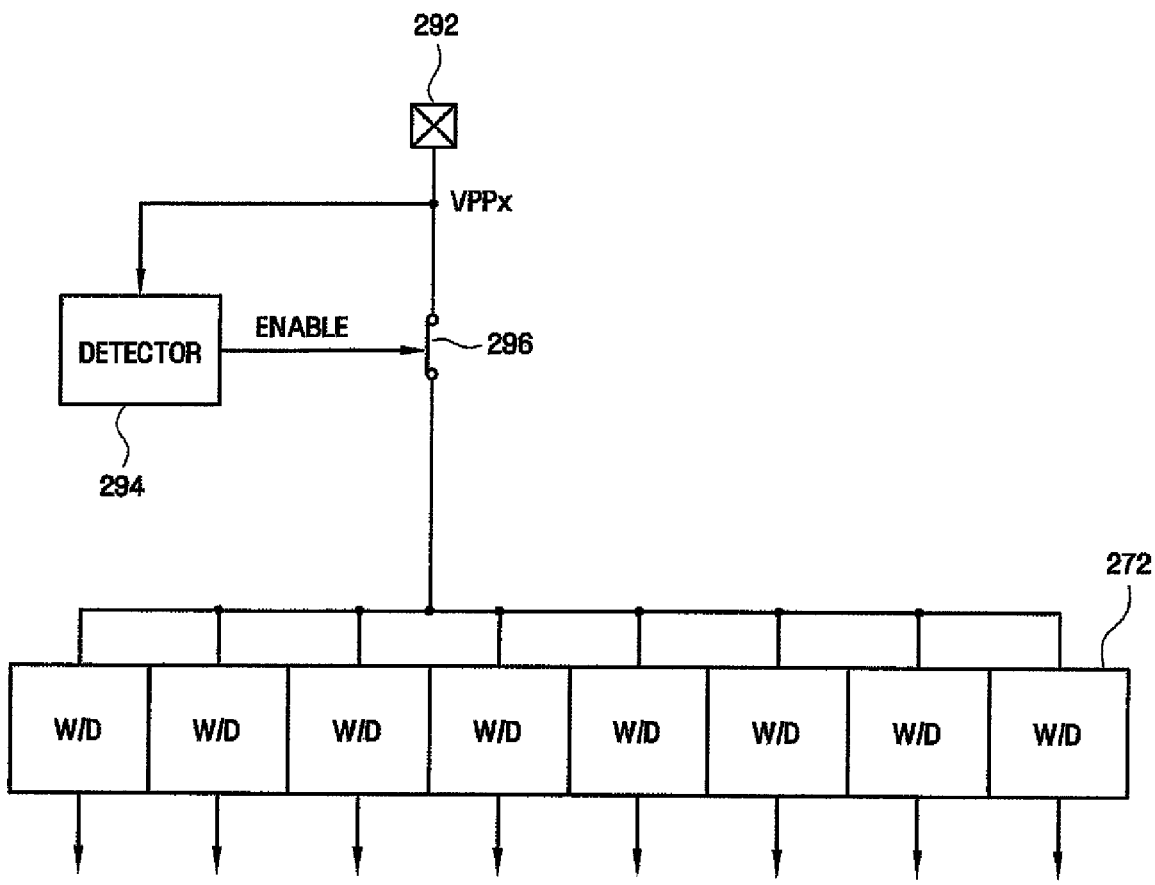
FIGS. 13 and 14 are related block and timing diagrams further illustrating a program operation performed using an external step-up voltage.
Figure 14:
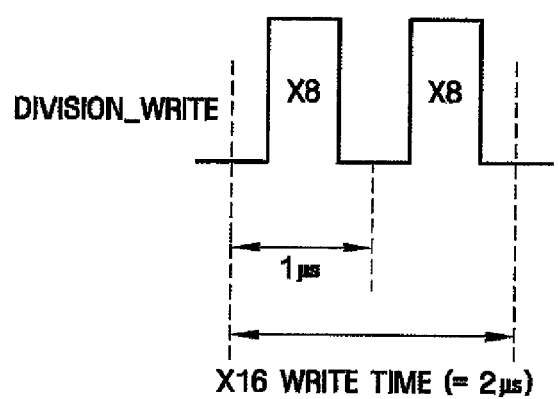

FIGS. 11 and 12 are related block and timing diagrams illustrating a program operation performed using the third internal step-up voltage VPP_WD. FIGS. 13 and 14 are related block and timing diagrams illustrating a program operation performed using the external step-up voltage VPPx.

Referring to FIGS. 11 and 12, data is simultaneously received via a plurality of input/output (I/O) pins (e.g., sixteen (16) I/O pins), and simultaneously written to a plurality of nonvolatile memory cells (e.g., sixteen (16) nonvolatile memory cells). For example, if the current level of a reset pulse provided to a nonvolatile memory cell is 1 mA, then 16 mA of current is required to simultaneously write data to sixteen (16) nonvolatile memory cells. In this case, if the efficiency of the third internal step-up voltage generator 286 is 10%, 160 mA of current has to flow through the nonvolatile memory in order to simultaneously write data to the sixteen (16) nonvolatile memory cells.

The amount of current that flows during the write operation is defined as 15 through 30 mA. In addition, since the current driveability of the third internal step-up voltage generator 286 is limited, a division write operation may be performed on a cell group-by-cell group basis, wherein each cell group includes one or more nonvolatile memory cells. For example, referring to FIG. 11, the third internal step-up voltage generator 286 may generate the third internal step-up voltage VPP_WD only as much as needed to drive two write drivers 272. Thus, referring to FIG. 12, sixteen (16) nonvolatile memory cells are divided into eight (8) cell groups and are written through 8 division write sessions. In addition, if one division write session lasts 1 μs, then 8 μs is required to write data to sixteen (16) nonvolatile memory cells.

Referring to FIGS. 13 and 14, if the write driver 272 operates using the external step-up voltage VPPx, the above limitations can be overcome. For example, eight (8) write drivers 272 can be simultaneously driven as illustrated in FIG. 13. Thus, as illustrated in FIG. 14, if one division write session lasts 1 μs, only 2 μs is required to write data to eight (8) nonvolatile memory cells. That is, the write driver 272 can operate much faster when using the external step-up voltage VPPx than when using the third internal step-up voltage VPP_WD which is generated internally.

The effects of the exemplary embodiments of the present invention described above may be summarized as follows. In general, a programming time may be given by:

$$tPGM=(tPGM\_SETUP+tPGM\_CMD+tPGM\_DATA+tPGM\_PUMP+tPGM\_WORD\times\text{number of words})/\text{number of words}$$

Specially, tPGM indicates a total programming time, tPGM_SETUP indicates the time required to receive an external step-up voltage from an external source and set up the external step-up voltage, tPGM_CMD indicates the time required to receive a program command from an external source, tPGM_DATA indicates the time required to receive data from an external source, tPGM_PUMP indicates the time required by the first and second internal step-up voltage generators 282 and 284 to generate the first and second internal step-up voltages VPP_X and VPP_Y, respectively, and tPGM_WORD indicates the time required to write one word.

In the exemplary embodiments of the present invention, set data instead of reset data is written during the program period. Therefore, tPGM_WORD can be reduced to approximately one fifth of the time conventionally required to write one word. In addition, in the exemplary embodiments of the present invention, the first and second internal step-up voltage generators 282 and 284 generate the first and second step-up voltages VPP_X and VPP_Y, respectively, during the set-up section. Therefore, tPGM_PUMP can be zero. When the write driver 272 uses the external step-up voltage VPPx, the number of nonvolatile memory cells that can be simultaneously written is increased. Therefore, tPGM_WORD can further be reduced. That is, according to the exemplary embodiments of the present invention, the program performance of the nonvolatile memory can be enhanced.

Figure 15:
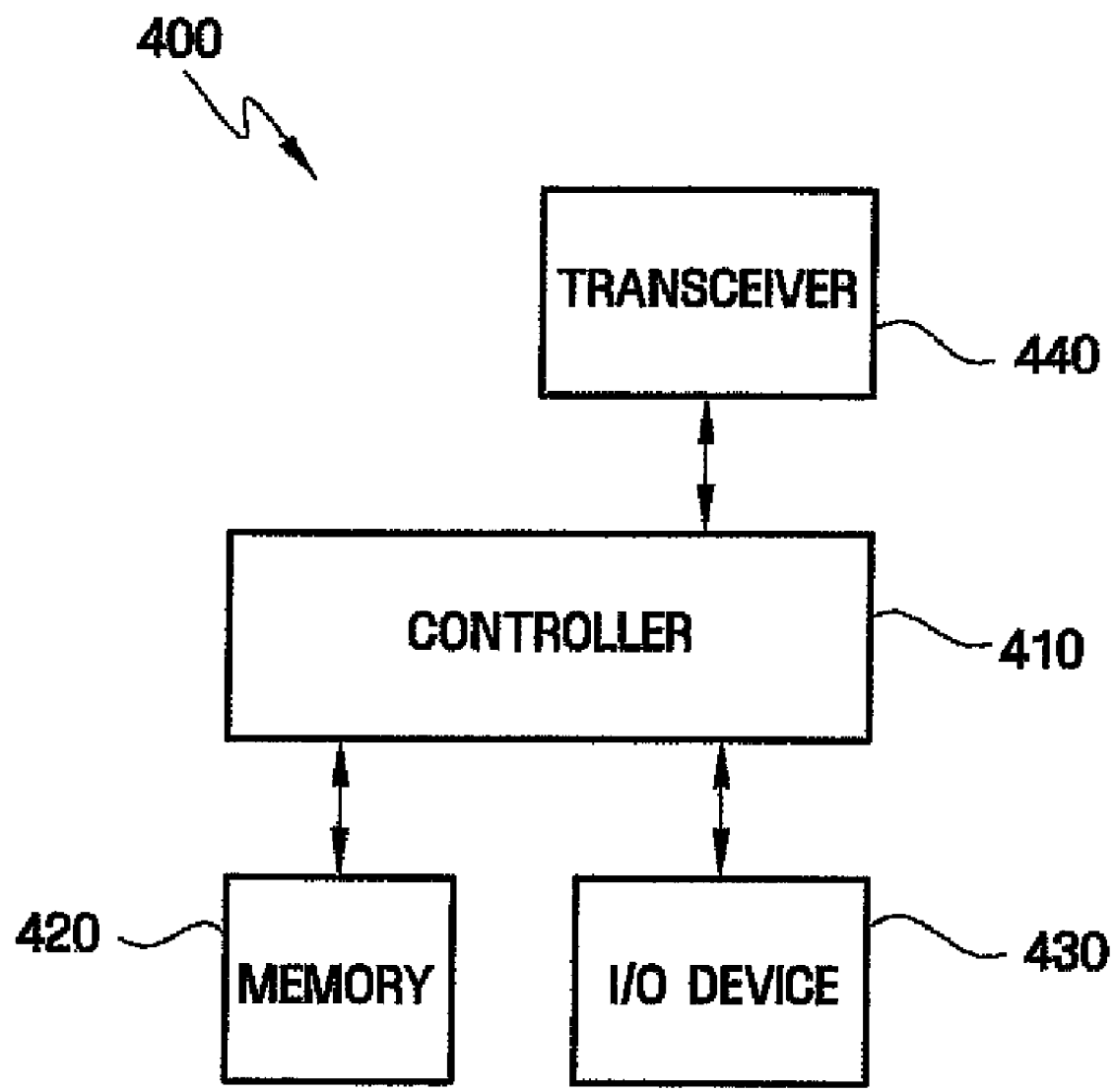
FIG. 15 is a schematic block diagram of a memory system including a nonvolatile memory according to an embodiment of the invention.

FIG. 15 is a schematic block diagram of a memory system 400 including a nonvolatile memory according to an embodiment of the invention. In FIG. 15, a portable media system is illustrated as a general example of the memory system 400. However, the present invention is not limited thereto. Examples of the portable media system may include a two-way communication system, a one-way pager, a two-way pager, a personal communication system, a portable computer, a personal data assistant (PDA), an MPEG audio layer-3 (MP3), and a digital camera.

Referring to FIG. 15, the media system 400 including the nonvolatile memory according to the exemplary embodiments of the present invention includes a controller 410, a memory 420, an input/output (I/O) device 430, and a transceiver 440.

The controller 410 may be a microprocessor, a digital signal processor, and a micro-controller.

The memory 420 is controlled by the controller 410 and stores messages which are transmitted to the memory system 400 or are to be transmitted to an external destination. That is, while the memory system 400 operates, the memory 420 stores a command executed by the controller 410 or stores data. The memory 420 may be composed of one or more memories of different types. For example, the memory 420 may use a volatile memory and/or a nonvolatile memory. In this case, the nonvolatile memory may be a nonvolatile memory using a resistance material according to the exemplary embodiments of the present invention.

The I/O device 430 is manipulated by a user to generate messages. The I/O device 430 may be a keypad or a monitor.

The memory system 400 may wirelessly transmit or receive messages via the transceiver 440 which is connected to an antenna (not shown). Here, the memory system 400 may transmit or receive messages using a protocol such as code division multiple access (CDMA), global system for mobile communication (GSM), North 20 American digital cellular (NADC), time division multiple access (TDMA), extended TDMA (ETDMA), wideband CDMA, or CDMA-2000.

While the present invention has been particularly shown and described with reference to exemplary embodiments thereof, it will be understood by those of ordinary skill in the art that various changes in form and detail may be made therein without departing from the scope of the present invention as defined by the following claims. The exemplary embodiments should be considered in a descriptive sense only and not for purposes of limitation.

What is claimed is:

1. A nonvolatile memory comprising:
   a memory cell array comprising nonvolatile memory cells; and
   a write circuit configured during a normal mode of operation and in response to a program command to write set data to a first group of the nonvolatile memory cells during a first program operation, and write reset data to a second group of the nonvolatile memory cells during a first erase operation, and during an acceleration mode of operation in response to the program command to write reset data to a third group of the nonvolatile memory cells during a second program operation, and write set data to a fourth group of the nonvolatile memory cells during a second erase operation, wherein the write circuit is supplied by an internally generated step-up voltage during the normal mode and by an externally provided step-up voltage during the acceleration mode.

2. The nonvolatile memory of claim 1, wherein the reset data is written faster than the set data.

3. The nonvolatile memory of claim 2, wherein the write circuit comprises:

a write driver enable signal provider providing a first enable signal upon receiving set data during the first program operation, and upon receiving the reset data during the second program operation; and a write driver enabled in response to the first enable signal and selectively providing a set pulse corresponding to the set data and a reset pulse corresponding to the reset data to a selected nonvolatile memory cell.

4. The nonvolatile memory of claim 2, further comprising:

a decoder configured to select one of the nonvolatile memory cells to which one of the set data and reset data is to be written during one of the first program operation and the second program operation; and a step-up voltage generator coupled to the decoder and configured to generate the internally generated step-up voltage.

5. The nonvolatile memory of claim 4, further comprising:

a command buffer receiving the program command and configured to generate an internal program signal applied to the write circuit, wherein the write circuit operates in the normal mode of acceleration mode in response to the internal program signal.

6. The nonvolatile memory of claim 4, further comprising:

a voltage pin receiving the externally provided step-up voltage;

a detector coupled to the voltage pin and configured to detect a level of the externally provided step-up voltage and provide a second enable signal in response to a detected level of the externally provided step-up voltage; and a switch coupled between the voltage pin and the write circuit, wherein the switch is turned ON in response to the second enable signal, wherein the step-up voltage generator is enabled in response to the second enable signal to supply the internally generated step-up voltage to the write circuit during the normal mode and the externally provided step-up voltage to the write circuit during the acceleration mode.

7. The nonvolatile memory of claim 1, wherein the nonvolatile memory cells are phase-change memory cells.

8. The nonvolatile memory of claim 7, wherein the phase-change memory cells are phase-change random access memory (PRAM) cells.

9. The nonvolatile memory of claim 7, wherein the write circuit is further configured during the normal mode of operation to perform the first program operation by erasing the first group of nonvolatile memory cells by writing reset data to all of the first group of nonvolatile memory cells, and then programming the second group of nonvolatile memory cells by writing set data to selected memory cells in the first group of nonvolatile memory cells.

10. The nonvolatile memory of claim 9, wherein the write circuit is further configured during the acceleration mode of operation to perform the second program operation by erasing the third group of nonvolatile memory cells by writing set data to all of the third group of nonvolatile memory cells, and then programming the fourth group of nonvolatile memory cells by writing reset data to selected memory cells in the third group of nonvolatile memory cells.

11. The nonvolatile memory of claim 1, wherein the second program operation is faster than the first program operation.

12. A memory system comprising:

a memory controller and a nonvolatile memory controlled by the memory controller, wherein the nonvolatile memory comprises:

a memory cell array comprising nonvolatile memory cells; and a write circuit configured during a normal mode of operation and in response to a program command to write set data to a first group of the nonvolatile memory cells during a first program operation and write reset data to a second group of the nonvolatile memory cells during a first erase operation, and during an acceleration mode of operation in response to the program command to write reset data to a third group of the nonvolatile memory cells during a second program operation and write set data to a fourth group of the nonvolatile memory cells during a second erase operation, wherein the write circuit is supplied by an internally generated step-up voltage during the normal mode and by an externally provided step-up voltage during the acceleration mode.

13. The memory system of claim 12, wherein reset data is written faster than the set data.

14. A method of driving a nonvolatile memory, wherein the nonvolatile memory comprises a memory cell array of nonvolatile memory cells, the method comprising:

determining whether to operate the nonvolatile memory in a normal mode or an acceleration mode;

upon determining to operate the nonvolatile memory in the normal mode and in response to a program command, supplying an internally generated step-up voltage to a write circuit to write set data to a first group of the nonvolatile memory cells during a first program operation and write reset data to a second group of the nonvolatile memory cells during a first erase operation; and upon determining to operate in the acceleration mode and in response to the program command, supplying an externally provided step-up voltage to the write circuit to write reset data to a third group of the nonvolatile memory cells during a second program operation and write set data to a fourth group of the nonvolatile memory cells during a second erase operation.

15. The method of claim 14, wherein the first program operation comprises erasing the first group of nonvolatile memory cells by writing reset data to all of the first group of nonvolatile memory cells, and then programming the second group of nonvolatile memory cells by writing set data to selected memory cells in the first group of nonvolatile memory cells.

16. The method of claim 15, wherein the second program operation comprises erasing the third group of nonvolatile memory cells by writing set data to all of the third group of nonvolatile memory cells, and then programming the fourth group of nonvolatile memory cells by writing reset data to selected memory cells in the third group of nonvolatile memory cells.

17. The method of claim 14, wherein the nonvolatile memory cells are phase-change memory cells.

18. The method of claim 17, wherein the phase-change memory cells are phase-change random access memory (PRAM) cells.

* * * * *